US007517740B2

(12) United States Patent
Kim et al.

(10) Patent No.: US 7,517,740 B2
(45) Date of Patent: Apr. 14, 2009

(54) METHOD OF CRYSTALLIZING/ACTIVATING POLYSILICON LAYER AND METHOD OF FABRICATING THIN FILM TRANSISTOR HAVING THE SAME POLYSILICON LAYER

(75) Inventors: Yong Hae Kim, Kyeongki-Do (KR); Choong Yong Sohn, Choongchungbuk-Do (KR); Jin Ho Lee, Daejeon-Shi (KR)

(73) Assignee: Electronics and Telecommunications Research Institute, Daejeon-Shi (KR)

( * ) Notice: Subject to any disclaimer, the term of this patent is extended or adjusted under 35 U.S.C. 154(b) by 287 days.

(21) Appl. No.: 10/909,457

(22) Filed: Aug. 3, 2004

(65) Prior Publication Data

US 2005/0142707 A1     Jun. 30, 2005

(30) Foreign Application Priority Data

Dec. 24, 2003  (KR) ............... 10-2003-0096039

(51) Int. Cl.
*H01L 21/00* (2006.01)
(52) U.S. Cl. .................. 438/151; 438/166
(58) Field of Classification Search ............ None
See application file for complete search history.

(56) References Cited

U.S. PATENT DOCUMENTS

| 4,389,257 | A | * | 6/1983 | Geipel et al. ............ 438/301 |
| 5,306,651 | A | * | 4/1994 | Masumo et al. .......... 438/166 |
| 5,561,081 | A | * | 10/1996 | Takenouchi et al. ...... 438/166 |
| 5,602,047 | A | * | 2/1997 | Tsai et al. ............... 438/160 |
| 5,946,560 | A | * | 8/1999 | Uochi et al. ............. 438/162 |
| 6,159,777 | A | * | 12/2000 | Takenouchi et al. ...... 438/149 |
| 6,166,399 | A |   | 12/2000 | Zhang et al. |
| 6,204,130 | B1 | * | 3/2001 | Gardner et al. .......... 438/287 |
| 6,245,602 | B1 | * | 6/2001 | Ho et al. ................. 438/158 |
| 6,429,483 | B1 | * | 8/2002 | Teramoto ................ 257/347 |
| 6,689,671 | B1 | * | 2/2004 | Yu et al. ................. 438/486 |
| 6,867,432 | B1 | * | 3/2005 | Teramoto ................. 257/66 |
| 6,953,714 | B2 | * | 10/2005 | Kimura et al. ........... 438/149 |
| 2001/0023090 | A1 | * | 9/2001 | Lee ....................... 438/149 |
| 2002/0105033 | A1 | * | 8/2002 | Zhang .................... 257/353 |
| 2003/0132439 | A1 | * | 7/2003 | Kimura et al. ............ 257/72 |

(Continued)

FOREIGN PATENT DOCUMENTS

JP            06085258 A  *   3/1994

(Continued)

OTHER PUBLICATIONS

Isao Hasegawa, et al.; "A Novel Crystallization Method for Silicon Films with a Near-infrared Laser and Absorption Layer—Zone Melting for Films—"; TFT2-1; AM-LCD' 03; pp. 25-28.

*Primary Examiner*—David E Graybill
(74) *Attorney, Agent, or Firm*—Lowe Hauptman Ham & Berner, LLP

(57) ABSTRACT

Provided is a method of crystallizing/activating a polysilicon layer and a method of fabricating a thin film transistor having the same polysilicon layer, in which when a gate material is patterned to form a gate electrode and define source/drain regions, the gate material on source/drain regions partially remains, so that crystallizing and activating processes are performed at the same time.

2 Claims, 3 Drawing Sheets

U.S. PATENT DOCUMENTS

| | | | |
|---|---|---|---|
| 2003/0148565 A1* | 8/2003 | Yamanaka | 438/200 |
| 2003/0162338 A1* | 8/2003 | Hwang et al. | 438/166 |
| 2004/0048422 A1* | 3/2004 | Kurosawa et al. | 438/151 |
| 2004/0051101 A1* | 3/2004 | Hotta et al. | 257/72 |
| 2004/0087124 A1* | 5/2004 | Kubota et al. | 438/591 |
| 2005/0142707 A1* | 6/2005 | Kim et al. | 438/166 |

FOREIGN PATENT DOCUMENTS

| | | |
|---|---|---|
| JP | 2002-50766 | 2/2002 |

* cited by examiner

METHOD OF CRYSTALLIZING/ACTIVATING POLYSILICON LAYER AND METHOD OF FABRICATING THIN FILM TRANSISTOR HAVING THE SAME POLYSILICON LAYER

BACKGROUND

1. Field of the Invention

The present invention generally relates to a method of crystallizing/activating a polysilicon layer and a method of fabricating a thin film transistor having the same polysilicon layer, and more particularly, to a method of crystallizing/activating a polysilicon layer and a method of fabricating a thin film transistor having the same polysilicon layer, in which a channel range of an amorphous silicon layer is crystallized and at the same time source/drain regions thereof is activated.

2. Discussion of Related Art

Amorphous silicon used as an active layer of a thin film transistor is advantageously fabricated by a simple process and at low temperature, but its electron mobility is relatively low, so that it is unsuitable to a high-speed circuit. Oppositely, in the case where polysilicon is used as the active layer, the electron mobility thereof is relatively high, so that it is suitable to the high-speed circuit even though its fabricating process is complicated. This is because the polysilicon has a finer crystallization structure and fewer defects than the amorphous silicon.

As a method of crystallizing the polysilicon, there are a solid phase crystallization (SPC) method, a metal induced crystallization (MIC) method, an excimer laser annealing (ELA) method, a static light scattering (SLS) method, etc. The SPC crystallizes the amorphous silicon at a high temperature, so that the SPC has an advantage of good layer quality but has a disadvantage of requiring a high temperature process. The MIC heats a predetermined metal deposited on the amorphous silicon and crystallizes the amorphous silicon, wherein the metal is employed in lowering an enthalpy of the amorphous silicon. The MIC is performed at a low temperature but has disadvantages that surface quality of the crystallized amorphous silicon is bad and its characteristic is deteriorated due to the metal.

The ELA and the SLS melt the amorphous silicon by a laser in an instant (e.g., ~30 nsec) and recrystallize it. The ELA melts the amorphous silicon by instantly supplying laser energy to the substrate on which the amorphous silicon is deposited, and refrigerates it, thereby crystallizing the polysilicon based on a silicon seed. Here, the silicon seed is some of the amorphous silicon, which is not melted by the laser. Oppositely, the SLS partially melts the amorphous silicon exposed to a laser beam through a mask, and employs the other portion of the amorphous silicon, which is not exposed to the laser beam, as the silicon seed. Here, a grain is vertically grown in a boundary between a liquid silicon region and a solid silicon region, but its lateral growth is also possible by adjusting power and irradiated region of the laser energy.

Hereinbelow, the conventional method of fabricating the polysilicon thin film transistor will be described with reference to FIGS. 1A through 1D which are cross sectional views illustrating a process of fabricating a conventional polysilicon thin film transistor.

Referring to FIG. 1A, a buffer layer 2 and an amorphous silicon layer are deposited on a substrate 1 in sequence. Then, the amorphous silicon is crystallized into the polysilicon by a laser 4 to be well-absorbed in the amorphous silicon.

Referring to FIG. 1B, a gate dielectric layer 5 and a gate material 6 are deposited, wherein the gate material 6 has good reflexibility. Then, a gate is formed by a photolithography process, and only a polysilicon layer of source/drain regions is doped by an ion implantation process.

Referring to FIG. 1C, a laser beam is irradiated to both the gate material and the polysilicon layer, so that the gate material having the good reflexibility is nearly invariable in temperature but the dopant of the polysilicon layer well-absorbing the laser beam is activated.

Referring to FIG. 1D, an interlayer dielectric layer 9 is deposited and then formed with a contact hole. Then, a metal layer 10 is formed.

Thus, in the conventional method, the crystallizing process and the activating process are separately performed, thereby complicating the process and increasing a processing cost.

SUMMARY OF THE INVENTION

The present invention is directed to a method of crystallizing/activating a polysilicon layer and a method of fabricating a thin film transistor having the same polysilicon layer, in which crystallizing and activating processes necessary for fabricating the poly silicon thin film transistor are performed at the same time, thereby enhancing its characteristic and reducing a processing cost.

One aspect of the present invention is to provide a method of crystallizing/activating a polysilicon layer, comprising depositing an amorphous silicon layer on a substrate; forming a gate material on the amorphous silicon layer; forming a gate electrode by patterning the gate material to define source/drain regions, allowing the gate material on the source/drain regions to partially remain; doping the source/drain regions by applying an ion implantation process to the whole structure; and crystallizing at least channel region of the amorphous silicon layer and activating at least source/drain regions of the amorphous silicon layer by irradiating a laser beam.

Another aspect of the present invention is to provide a method of fabricating a polysilicon thin film transistor, comprising: depositing an amorphous silicon layer on a substrate; forming a gate material on the amorphous silicon layer; forming a gate electrode by patterning the gate material to define source/drain regions, allowing the gate material on the source/drain regions to partially remain; doping the source/drain regions by applying an ion implantation process to the whole structure; crystallizing at least channel region of the amorphous silicon layer and activating at least source/drain regions of the amorphous silicon layer by irradiating a laser beam; removing the gate material remained on the source/drain regions; and forming the source/drain electrode by forming an interlayer dielectric layer with a contact hole on the whole structure.

According to an aspect of the invention, the gate material has a deposited thickness of 1,000 Å through 5,000 Å and a remained thickness of 10 Å through 1,000 Å. Further, the gate electrode absorbs the laser beam and transforms laser energy into heat energy when the laser beam is irradiated, and the heat energy is transferred to and crystallizes the channel region of the amorphous silicon layer.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

FIGS. 2A through 2E are cross sectional views illustrating a process of fabricating a polysilicon thin film transistor according to an embodiment of the present invention.

Figure 1A:
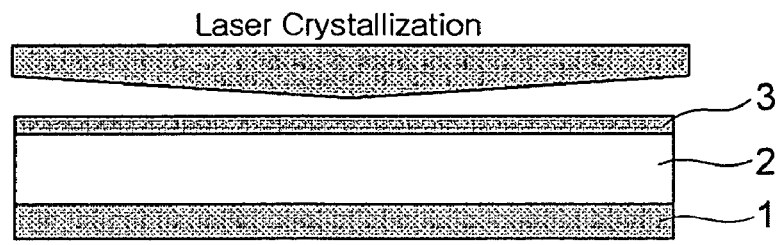
FIGS. 1A through 1D are cross sectional views illustrating a process of fabricating a conventional polysilicon thin film transistor.
Figure 1B:
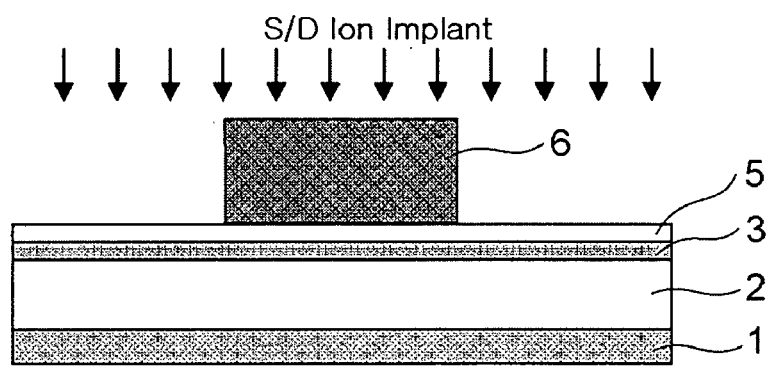
Figure 1C:
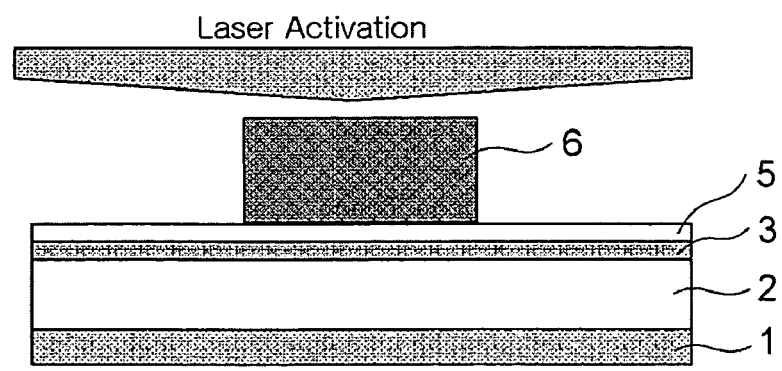
Figure 1D:
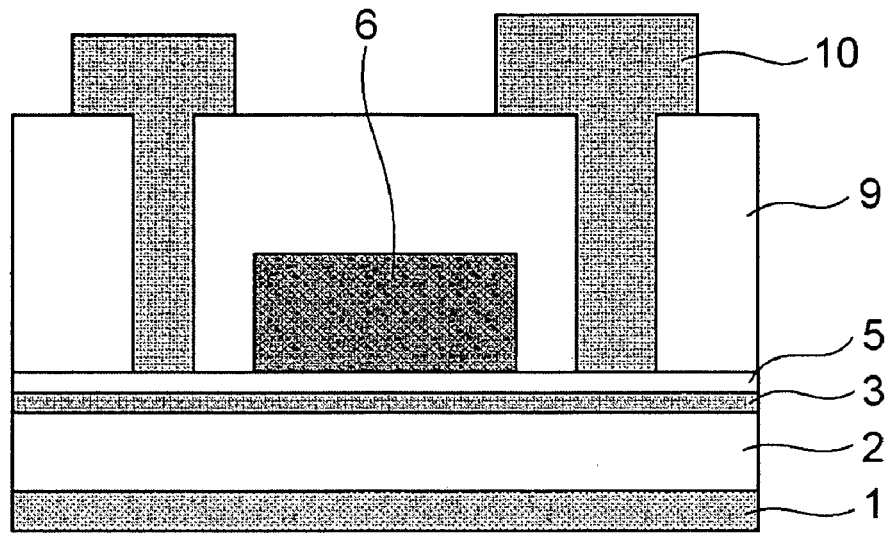
Figure 2A:
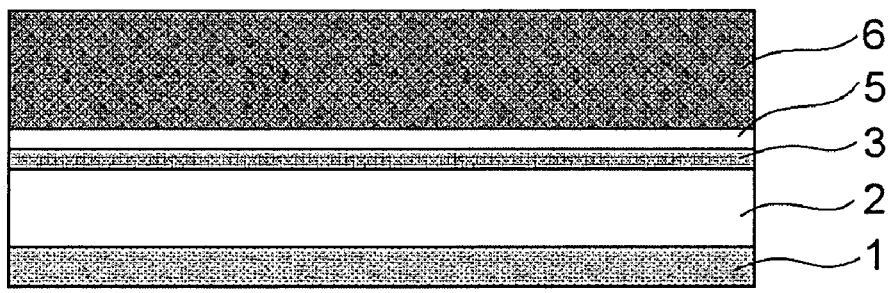
FIGS. 2A through 2E are cross sectional views illustrating a process of fabricating a polysilicon thin film transistor according to an embodiment of the present invention.

Referring to FIG. 2A, a buffer layer 2 is deposited on a substrate 1, and an amorphous silicon layer 3 is deposited on the buffer layer 2. The substrate 1 can be made of various materials such as glass, silicon, plastic, etc. The buffer layer 2 can be made of a well-known dielectric material such as silicon oxide, silicon nitride, etc. and deposited by a plasma enhanced chemical vapor deposition (PECVD) process. Preferably, the buffer layer 2 has a thickness of 1,000 Å through 10,000 Å. Further, the buffer layer 2 is used for decontamination. The amorphous silicon layer 3 is formed on the buffer layer 2. For example, the amorphous silicon layer 3 is formed by the PECVD process employing monosilane ($SiH_4$) gas diluted by argon (Ar) gas as source gas.

Then, a gate dielectric layer 5 and a gate material 6 are deposited. Preferably, the gate dielectric layer 5 has a thickness of 500 Å through 2,000 Å, and the gate material has a thickness of 1,000 Å through 5,000 521 . Further, the gate material is preferably selected among materials which can absorbs a laser beam well, for example, molybdenum (Mo), chrome (Cr), aluminum (Al), a polysilicon layer, or a combination layer of them.

Figure 2B:
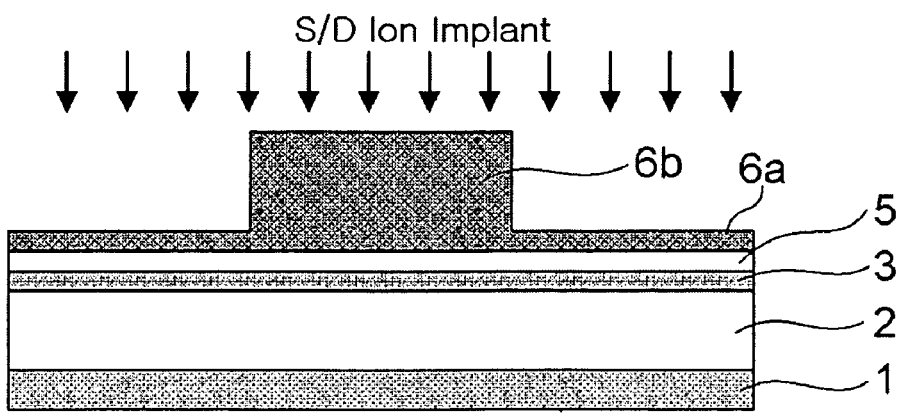

Referring to FIG. 2B, a gate electrode 6b is formed by photolithography process. At this time, the gate material is not fully etched and remains by a thickness of about 10 Å through 1,000 Å. Here, the remained gate material 6a except the gate electrode 6b is used in the ion implantation and crystallization for forming source/drain electrodes. Thus, in order to form the source/drain electrodes, the remained gate material 6a preferably has a predetermined thickness enough to not only allow an ion to be implanted thereinto but also minimize the absorption of the laser beam. If the remained gate material 6a is too thick, the activation may not be smoothly performed. Oppositely, if the remained gate material is too thin, the activation may be excessively performed. Accordingly, the thickness of the remained gate material 6a should be appropriately adjusted.

When the ion implantation is performed, the amorphous silicon layer is not doped at a region having a relatively thick gate material but at source/drain regions having a relatively thin gate material. Here, the dopant preferably includes phosphorous (P), arsenic (As), etc. in the case of an N-type, and boron (B) in the case of a P-type.

Figure 2C:
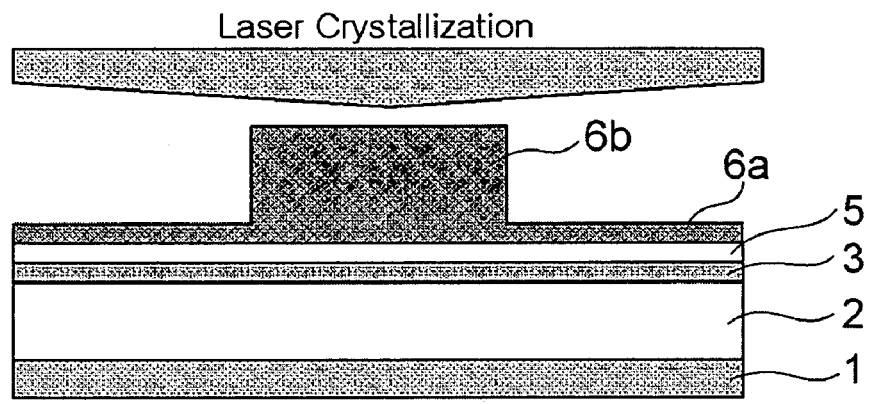

Referring to FIG. 2C, when a xenon chloride (XeCl) excimer laser beam having a wavelength of 308 nm is irradiated to the whole structure, the gate electrode 6b well absorbs the laser beam, so that the laser energy is transformed into heat energy. This heat energy is transferred to a channel region of the amorphous silicon layer and crystallizes the amorphous silicon into the polysilicon.

On the other hand, when long wavelength light is used and not absorbed in the amorphous silicon layer, the source/drain regions absorb light relatively small as compared with the channel region, so that the source/drain regions are just activated by moderate heat energy.

Thus, the crystallization and the activation are performed at the same time, so that a processing cost is decreased. Also, the crystallization and the activation are performed using the heat energy, so that a electron trap level such as a grain boundary is eliminated, thereby enhancing characteristics of the polysilicon thin film transistor.

Figure 2D:
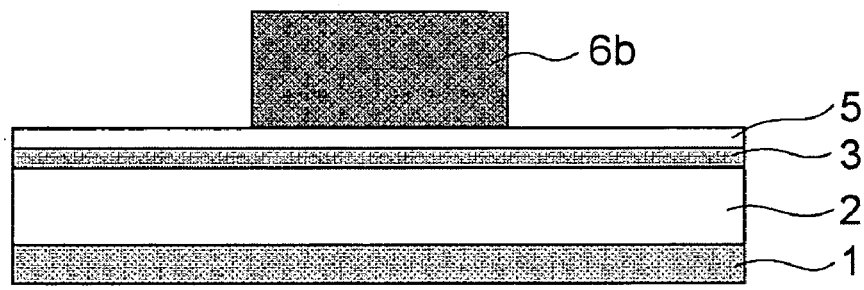

Referring to FIG. 2D, the gate material 6a remained in the source/drain regions is completely removed by an etching process.

Figure 2E:
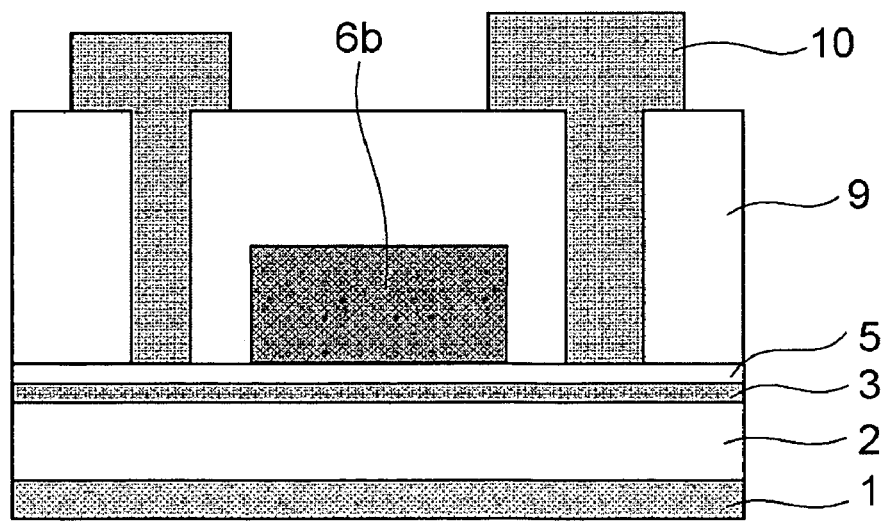

Referring to FIG. 2E, an interlayer dielectric layer 10 is formed on the gate electrode 6 and patterned to have a contact hole. Then, a metal layer 11 is deposited and patterned to allow the source/drain electrodes of the activated layer to be connected with a data line through the contact hole. Here, the interlayer dielectric layer 10 preferably has a thickness of 2,000 Å through 8,000 Å.

Through the above-described processes, the N-type or P-type poly silicon thin film transistor can be fabricated. Alternately, the foregoing process can be applied to a well-known lightly doped drain (LDD) structure. In the case of the LDD structure, lightly doping is performed using the gate electrode 6b as a doping mask. Then, a spacer or a photoresist which can be functioned as a doping mask is formed at both sides or one side of the gate electrode 6b in a spacer forming process or other processes. Then, highly doping is performed using the spacer or the photoresist as the doping mask. Then, the foregoing source/drain electrodes are formed, thereby fabricating the LDD structure.

The foregoing thin film transistor comprises the silicon layer, the gate oxidation layer, the interlayer material, the electrodes, etc. Here, the silicon layer includes the amorphous silicon layer or the polysilicon layer; the gate oxidation layer includes an oxide layer, a nitride layer, an aluminum oxide layer, etc.; the interlayer material includes an oxide layer, a nitride layer, etc.; the electrode includes metal such as aluminum (Al), chrome (Cr), etc.

As described above, the thin film transistor with the polysilicon according to the present invention gives the following effects:

First, the crystallization and the activation are performed at the same time, so that a processing cost is reduced Second, the heat energy is transferred to the whole wafer area after the ion implantation and thus the defects of the grain boundary under the gate electrode are eliminated, so that the thin film transistor has good reliability without current leakage.

While the present invention has been described with reference to a particular embodiment, it is understood that the disclosure has been made for purpose of illustrating the invention by way of examples and is not limited to limit the scope of the invention. And one skilled in the art can make amend and change the present invention without departing from the scope and spirit of the invention.

What is claimed is:

1. A method of fabricating a polysilicon thin film transistor, the method comprising:

depositing an amorphous silicon layer on a substrate;

forming a gate dielectric material on the amorphous silicon layer;

forming a gate metal material on the gate dielectric material; forming a gate metal electrode by partially etching the gate metal material, wherein the amorphous silicon layer is defined to have a channel region, a source region and a drain region, the channel region being under the gate metal electrode, and the source region and the drain region being on both sides of the channel region, and wherein the gate metal material partially remains on the source region and the drain region as a remained gate metal material layer;

doping the source and drain regions of the amorphous silicon layer by applying an ion implantation process;

crystallizing a channel region of the amorphous silicon layer and activating the source and drain regions of the amorphous silicon layer by irradiating the gate, source and drain regions with a laser beam simultaneously;

removing the gate metal material remaining on the source and drain regions; and forming a source electrode and a drain electrode by forming an interlayer dielectric layer with a contact hole, wherein the gate metal material has a deposited thickness of 1,000 Å through 5,000 Å and the remained gate metal material layer thickness of 10 Å through 1,000 Å.

2. The method as claimed in claim 1, wherein the gate metal electrode absorbs the laser beam and transforms laser energy into heat energy when the gate metal electrode is irradiated, and the heat energy is transferred to and simultaneously crystallizes the channel region of the amorphous silicon layer.

* * * * *